United States Patent
Smedegaard-Pedersen et al.

(10) Patent No.: US 6,476,674 B2
(45) Date of Patent: Nov. 5, 2002

(54) METHOD AND APPARATUS FOR ERROR CORRECTION OF AMPLIFIER

(75) Inventors: Michael Smedegaard-Pedersen, Flensburg (DE); James B. Reedy, Huntington Beach, CA (US)

(73) Assignee: Momentum Data Systems, Fountain Valley, CA (US)

( * ) Notice: Subject to any disclaimer, the term of this patent is extended or adjusted under 35 U.S.C. 154(b) by 0 days.

(21) Appl. No.: 09/768,685

(22) Filed: Jan. 24, 2001

(65) Prior Publication Data

US 2002/0097090 A1 Jul. 25, 2002

(51) Int. Cl.[7] .............................................. H03F 3/217
(52) U.S. Cl. .................... 330/251; 330/207 A; 381/120
(58) Field of Search ..................... 330/10, 136, 207 A, 330/251, 69, 11; 381/120, 121

(56) References Cited

U.S. PATENT DOCUMENTS

| | | | |
|---|---|---|---|
| 4,516,080 A | | 5/1985 | Garde |
| 4,523,152 A | | 6/1985 | Garde |
| 5,115,205 A | * | 5/1992 | Holmes, Jr. ................... 330/10 |
| 5,796,305 A | * | 8/1998 | Sondermeyer .............. 330/105 |
| 5,905,407 A | | 5/1999 | Midya |
| 6,084,468 A | * | 7/2000 | Sigmon et al. ............. 330/136 |
| 6,127,888 A | * | 10/2000 | Kukobo ....................... 330/146 |

* cited by examiner

*Primary Examiner*—Robert Pascal
*Assistant Examiner*—Henry Choe
(74) *Attorney, Agent, or Firm*—Knobbe, Martens, Olson & Bear, LLP

(57) ABSTRACT

An apparatus and a method correct the distortion in the output of a first amplifier (e.g., a switching amplifier) by using a second amplifier (e.g., a linear amplifier) coupled in series with the first amplifier. The output of at least the first amplifier is compared to the input signal to generate an error signal representing the distortion in the output of the first amplifier. The error signal is amplified by the second amplifier to generate a correction signal that is interposed in series with the output of the first amplifier to offset the distortion, thereby generating an output signal having little or no distortion. The apparatus and method include both feedback embodiments and feedforward embodiments.

20 Claims, 10 Drawing Sheets

METHOD AND APPARATUS FOR ERROR CORRECTION OF AMPLIFIER

BACKGROUND OF THE INVENTION

1. Field of the Invention

The present invention relates generally to amplifiers, and, more particularly, relates to a method and apparatus for correcting distortion in amplifiers.

2. Description of the Related Art

Switching amplifiers are used to provide amplification of audio signals and other signals where efficient amplification is required while maintaining a relatively high efficiency is required. Such amplifiers are often referred to as Class-D amplifiers. Class-D amplifiers process analog signals using pulse width modulation (PWM), pulse duration modulation (PDM), pulse amplitude modulation (PAM), or the like. For example, in PWM Class-D amplifiers used to amplify audio signals, high-frequency rectangular waves of constant amplitude, but varying duty cycles, are output from an integrated circuit or from a circuit comprising multiple components. The rectangular waves of varying duty cycles contain the audio information. The output signal is low-pass filtered to isolate the audio information from the high-frequency switching signal to reproduce the original audio signal at an amplified magnitude. Because of their compact size, their relatively low power dissipation, and their relatively high efficiency, Class-D amplifiers and other switching amplifiers are finding extensive use in consumer audio electronics.

Although switching amplifiers are finding increasing use in consumer electronics, such amplifiers have historically been avoided for very high-end audio systems where very low distortion and very low noise are required. Because of the characteristics of switching amplifiers, switching amplifiers tend to have more distortion than conventional linear amplifiers. Historically, designers have had difficulty in implementing efficient error correction, or feedback, around the output stage to substantially reduce or eliminate the distortion. Thus, a need continues to exist for an amplifier having the low cost and high efficiency characteristics of a switching amplifier, but with the low distortion of a linear amplifier.

SUMMARY OF THE INVENTION

The present invention is responsive to the foregoing problem by providing an apparatus and a method for correcting the distortion in the output of a switching amplifier. In particular, the present invention uses a supplemental amplifier (e.g., a linear amplifier) coupled in series with a primary amplifier (e.g., a switching amplifier) to provide correction signals that not only attenuate in-band distortion, but also attenuate RF components that are not filtered out by the low-pass filter.

One aspect of the present invention is an apparatus that amplifies an input signal and that generates a low-distortion output signal. In the apparatus, a first amplifier (i.e., a primary amplifier) has a first input that receives an input signal to be amplified and has a first output that generates a first output signal that is an amplified reproduction of the input signal. The first output signal has distortion. A second amplifier (i.e., a supplemental or secondary amplifier) has a second input that receives an error signal. The second amplifier has a second output that generates a second output signal that is an amplified reproduction of the error signal. The first output of the first amplifier and the second output of the second amplifier are connected in series to generate a system output signal that is the sum of the first output signal and the second output signal. A correction circuit compares a signal responsive to the input signal to a signal responsive to at least the first output signal of the first amplifier and generates the error signal provided to the second amplifier. In certain configurations, the signal responsive to at least the first output signal is responsive to the sum of the first output signal and the second output signal. In alternative configurations, the signal responsive to at least the first output signal is responsive to only the first output signal.

In particular embodiments in accordance with this aspect of the invention, the first amplifier is a switching amplifier (e.g., a full-bridge switching amplifier or a half-bridge switching amplifier) and the second amplifier is a linear amplifier. Other combinations of amplifiers can also be advantageously incorporated into the present invention. In preferred embodiments, the system output signal is provided to a load, such as a transducer (e.g., a speaker in an audio system). In particular embodiments, the load is connected in series with the first amplifier and the second amplifier. In alternative embodiments, the load is connected in a bridge configuration between the first amplifier and the second amplifier.

Another aspect of the present invention is a method of generating a low-distortion output signal in response to an input signal. The method receives an input signal to be amplified. The method generates a first output signal that is an amplified reproduction of the input signal. The first output signal includes distortion. The method generates a second output signal that is an amplified reproduction of an error signal. The second output signal is generated in series with the first output signal, and the first output signal and the second output signal are added to generate a system output signal. The error signal is generated by comparing a signal responsive to at least the first output signal with a signal responsive to the input signal. In one embodiment of the method using feedback error correction, the signal responsive to at least the first output signal is responsive to the sum of the first output signal and the second output signal. In an alternative embodiment of the method using feedforward error correction, the signal responsive to at least the first output signal is responsive to only the first output signal.

Another aspect of the present invention is an apparatus that amplifies an input signal and that generates a low-distortion output signal. The apparatus comprises a first amplifier that receives an input signal to be amplified and that generates an first output voltage responsive to the input signal. A second amplifier is connected in series with the first amplifier. The second amplifier receives an error signal and generates a second output voltage responsive to the error signal. At least one output terminal provides a system output voltage equal to the sum of the first output voltage and the second output voltage.

Another aspect of the present invention is a method of generating a low-distortion output signal in response to an input signal. The method comprises receiving an input signal to be amplified. The method generates a first output voltage that is an amplified reproduction of the input signal with distortion. The method also generates a second output voltage that is an amplified reproduction of an error signal representing the distortion in the first output voltage. The second output voltage is generated in series with the first output voltage. The first output voltage and the second output voltage are added to generate a system output signal in which the distortion in the first output voltage is reduced by the second output voltage.

Another aspect of the present invention is an apparatus that amplifies an input signal and that generates an output signal. The apparatus comprises a first amplifier that receives an input signal to be amplified and that generates an first output voltage responsive to the input signal. The apparatus further comprises a second amplifier connected in series with the first amplifier. The second amplifier receives a signal responsive to the input signal and generates a second output voltage responsive to the input signal. At least one output terminal provides a system output voltage equal to the sum of the first output voltage and the second output voltage.

BRIEF DESCRIPTION OF THE DRAWINGS

The present invention will be described below in connection with the accompanying drawing figures in which.

DETAILED DESCRIPTION OF THE PREFERRED EMBODIMENTS

Figure 1:
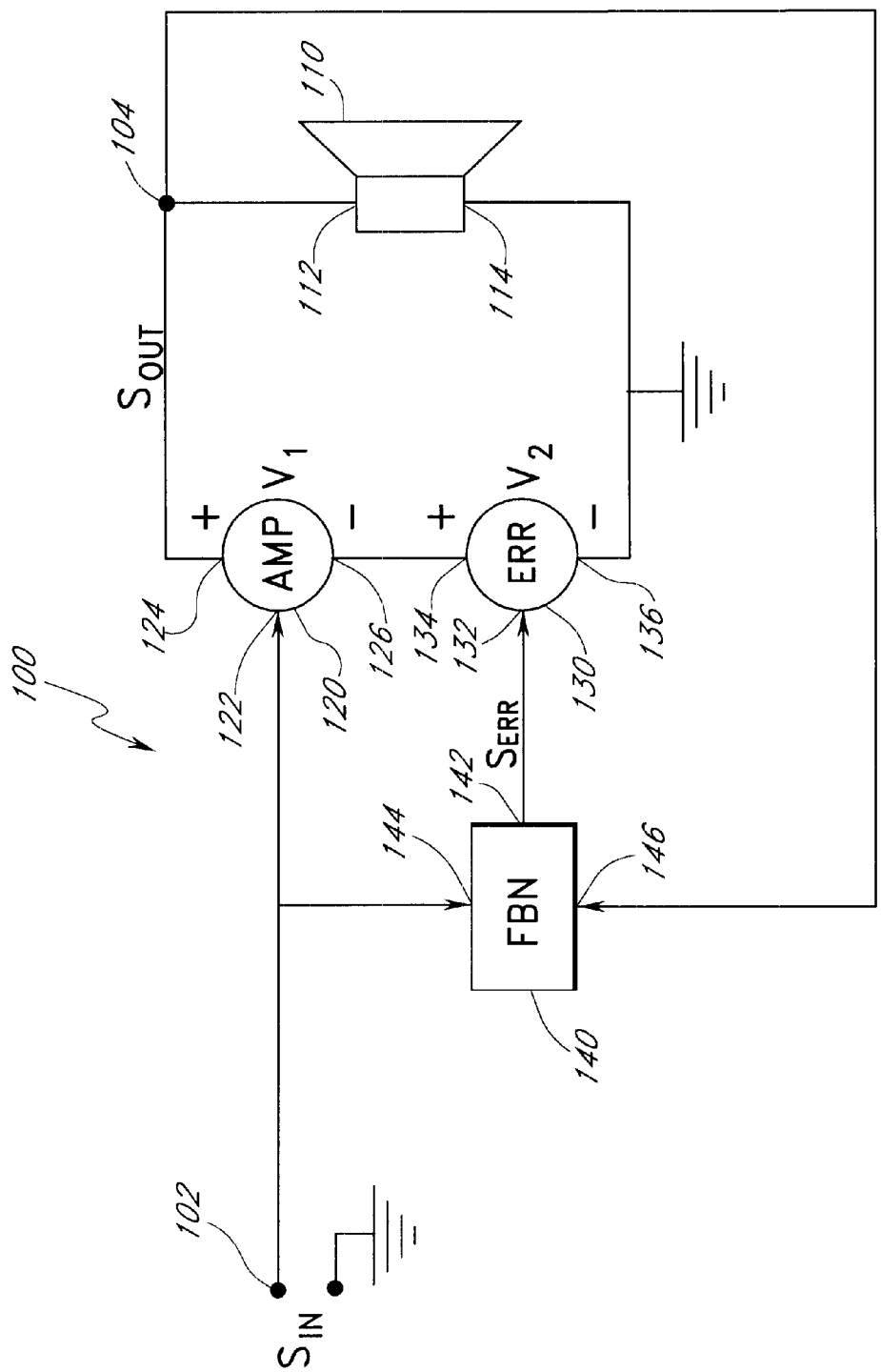
FIG. 1 illustrates a block diagram of an exemplary amplification system in accordance with one aspect of the present invention.

FIG. 1 illustrates an exemplary amplification system 100 in accordance with the present invention. The amplification system includes an input port 102 that receives an analog input signal $S_{IN}$ to be amplified and that includes an output node 104 that outputs an amplified analog output signal $S_{OUT}$. In the system 100, the input port 102 is referenced to a common ground reference. Thus, the analog input signal $S_{IN}$ comprises an analog voltage referenced to the ground reference. It should be understood that the input port 102 can also advantageously be a differential input port that receives a differential input signal.

In FIG. 1, the output node 104 is also referenced to the ground reference. The output node 104 is connected to a first terminal 112 of a speaker 110 (or other transducer). A second terminal 114 of the speaker 110 is connected to the ground reference. The speaker 110 receives the amplified analog output signal $S_{OUT}$ and operates as a transducer to convert the output signal to audible sounds.

Although the system 100 is described herein for driving a speaker 110, it should be understood that the system 100 can also be used to provide the amplified analog output signal $S_{OUT}$ to other transducers, such as, for example, headphones, hearing aids, electric motors, electrical actuators, or the like, which should be driven by an analog signal having very low distortion. In the examples of electric motors and electrical actuators, the motors or actuators operate as transducers to convert the analog output signal into motion.

Although the output node 104 is shown as being referenced to the ground reference, the output node 104 can also be considered as a differential output port, wherein the first terminal 112 of the speaker 110 (or other transducer) is connected to one of the differential outputs, and wherein the second terminal 114 of the speaker 110 is connected to the second differential output.

The amplification system 100 further includes a first amplifier (AMP) 120, which is a switching amplifier in the preferred embodiment. As described herein, the first amplifier 120 is the primary amplifier in the amplification system 100 because it is the primary source of power for the amplification system 100. The first amplifier 120 has an input terminal 122 connected to the input port 102 to thereby receive the analog input signal. The first amplifier 120 is connected to a power supply (not shown) in a conventional manner. The first amplifier 120 has a first output terminal 124 and a second output terminal 126. The first amplifier 120 operates in a known manner to generate an analog output voltage $V_1$ between the two output terminals 124, 126. The analog output voltage $V_1$ is an amplified reproduction of the analog input signal $S_{IN}$ at the input port 102. The first amplifier 120 is able to generate a large output voltage with relatively large current capabilities. However, as discussed above, typical switching amplifiers have more distortion in the output signal than is desirable in many applications, such as, for example, in high-end audio systems.

The first output terminal 124 of the first amplifier 120 is connected to the output node 104 of the amplification system 100 and is thus connected to the first terminal 112 of the speaker 110 (or other transducer). In a conventional amplification system (not shown), the second output terminal 126 of the first amplifier 120 would be connected directly to the ground reference and thus to the second terminal 114 of the speaker 110. (In a differential system without a ground reference, the second output terminal 126 would be connected only to the second terminal 114 of the speaker 110.)

Unlike conventional amplification systems, the amplification system 100 of FIG. 1 includes a second amplifier (ERR) 130 in series with the first amplifier 120. As discussed below, the second amplifier 130 operates as an error amplifier. The second amplifier 130 provides less power to the amplification system 100 and is also referred to as a secondary amplifier or a supplemental amplifier. The second amplifier 130 preferably has very low distortion characteristics. As discussed below, the second amplifier 130 does not have to provide a large voltage swing on its output terminals. The second amplifier 130 can be implemented as a Class A or Class AB linear amplifier, and can also be implemented as a low-distortion Class D amplifier, a Class G amplifier or a Class H amplifier. Because the second amplifier 130 has lower power handling requirements than the first amplifier 120, the second amplifier 130 can be more easily selected or designed for low distortion.

The second amplifier 130 has an input terminal 132, a first output terminal 134 and a second output terminal 136. The second amplifier 130 generates an amplified reproduction of an analog signal at the input terminal 132 as an analog output signal $V_2$ between the first output terminal 134 and the second output terminal 136. The first output terminal 134 of the second amplifier 130 is connected to the second output terminal 126 of the first amplifier 120. The second output terminal 136 of the second amplifier 130 is connected to the ground reference, and is thus connected to the second terminal 114 of the speaker 110 (or other transducer). Although the second output terminal 136 is shown as a signal terminal in FIG. 1, in particular embodiments of the present invention, the second output terminal 136 of the second amplifier 130 advantageously corresponds to the low voltage reference (e.g., the power supply ground reference) of the second amplifier 130.

As shown in FIG. 1, the first amplifier 120 and the second amplifier 130 are connected in series between the output node 104 and the ground reference such that a common current flows through the two amplifiers and the transducer. As discussed in more detail below, the output signal $S_{OUT}$ on the output node 104 is the sum of the output signal $V_1$ generated by the first amplifier 120 and the output signal $V_2$ generated by the second amplifier 130. Thus, the voltage $S_{OUT}$ applied to the speaker 110 (or other transducer) is the sum of the voltages generated by the two amplifiers 120, 130.

The input terminal 132 of the second amplifier 130 is connected to the output terminal 142 of an error correction circuit, which in FIG. 1 is implemented as a feedback network (FBN) 140. The feedback network 140 has a first input terminal 144 connected to the input port 102 to receive the input signal $S_{IN}$. The feedback network 140 has a second input terminal 146 connected to the output node 104 to receive the output signal $S_{OUT}$. As will be discussed in more detail below, the feedback network 140 compares the output signal $S_{OUT}$ with the input signal $S_{IN}$ and generates an error signal $S_{ERR}$ on the output terminal 142. The error signal is provided as the input to the second amplifier 130 via the input terminal 132. The combination of the feedback network 140 and the second amplifier 130 operates to detect and correct errors in the output signal $S_{OUT}$ caused by distortion or other anomalies in the first amplifier 120. In particular, the feedback network 140 causes the second amplifier 130 to generate the voltage $V_2$ with a magnitude and a polarity that offsets any difference between the voltage $V_1$ and the voltage $S_{IN}$ so that the output voltage $S_{OUT}$ represents an amplified reproduction of the input voltage $S_{IN}$ with very low distortion.

Figure 2:
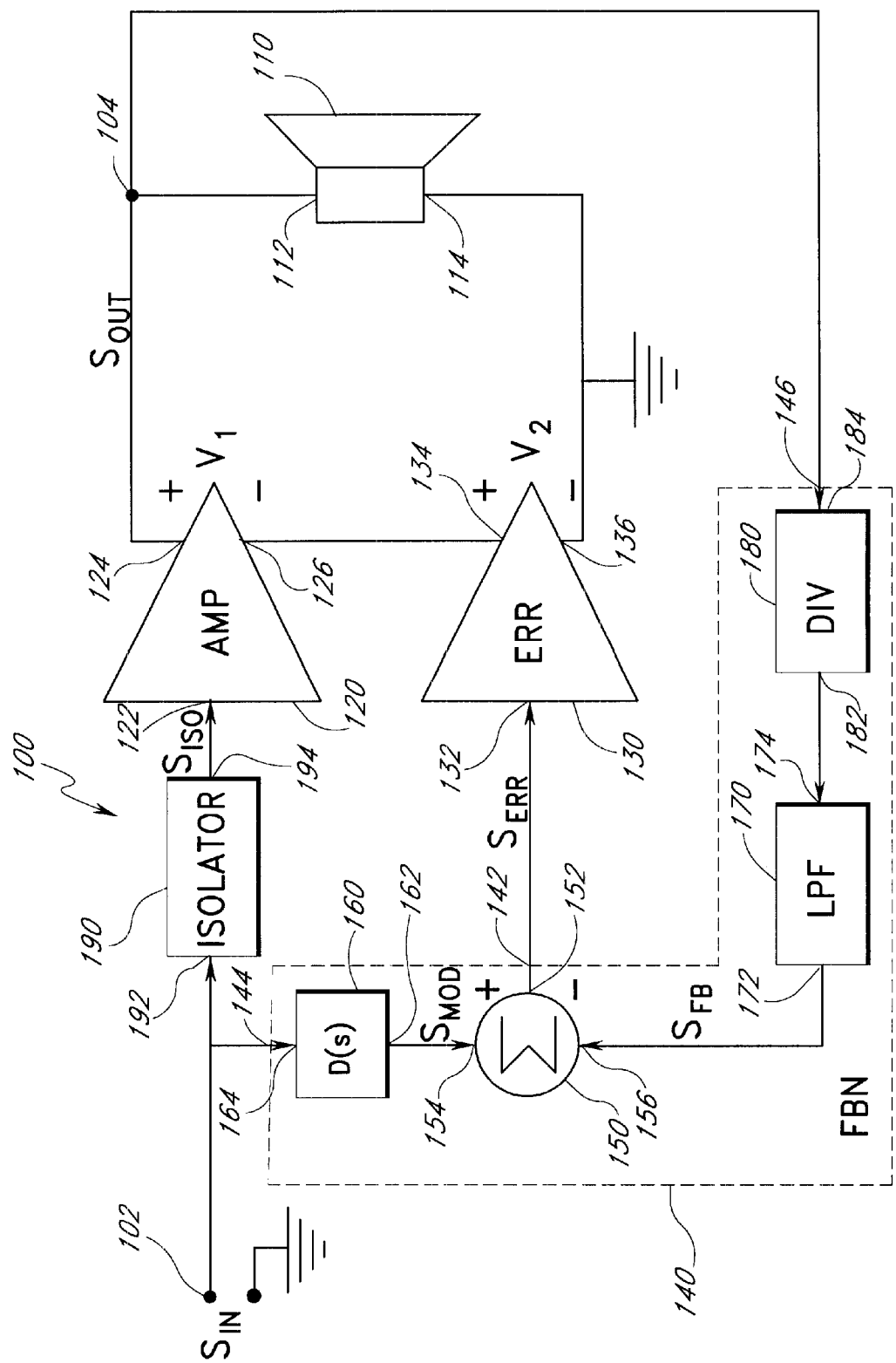
FIG. 2 illustrates a more detailed block diagram of a particular embodiment of the amplification system of FIG. 1.

FIG. 2 illustrates a more detailed block diagram of a preferred embodiment of the amplification system 100 of FIG. 1. In FIG. 2, the feedback network 140 is illustrated as including an analog summing circuit 150 having an output terminal 152, a first non-inverting (+) input terminal 154, and a second inverting (−) input terminal 156. The output terminal 152 of the summing circuit corresponds to the output terminal 142 of the feedback network 140 and is thus connected to the input terminal 132 of the second amplifier 130. The output terminal 152 of the summing circuit 150 generates a sum output signal that is the difference between a first signal applied to the non-inverting input terminal 154 and a second signal applied to the inverting input terminal 156. The sum output signal will have a relatively positive value if the first signal is greater than the second signal and will have a relatively negative value if the first signal is less than the second signal.

The non-inverting input terminal 154 of the summing circuit 150 is connected to an output terminal 162 of an analog signal processing (D(s)) circuit 160. The transfer function of the first amplifier 120 is GM(s)H(s), where G is the gain of the first amplifier, M(s) is the transfer function of the modulator in the first amplifier (when the first amplifier is implemented as a switching amplifier), and H(s) is the transfer function of the output low-pass filter within the first amplifier. The signal processing circuit 160 should have a transfer function D(s) equal to M(s)H(s). Since M(s) is essentially negligible for most amplifiers and can be ignored, D(s) for the signal processing circuit 160 is implemented to be equal to H(s) using an active topology. If M(s) is non-negligible for a particular implementation of the first amplifier 120, the signal processing circuit 160 can implement a corresponding M(s) as an all-pass delay network in conjunction with H(s). Persons skilled in the art are familiar with the implementation of H(s) and M(s) using active topologies and all-pass delay networks. If the first amplifier 120 is implemented by another class of amplifier, the transfer function can be readily determined and duplicated in the transfer function D(s) for the signal processing circuit 160.

An input terminal 164 of the signal processing circuit 160 corresponds to the input terminal 144 of the feedback network 140 and is thus connected to the input port 102 to receive the analog input signal $S_{IN}$. As discussed above, the analog input signal $S_{IN}$ is also applied to the input terminal 122 of the first amplifier 120. The output terminal 162 of the signal processing circuit 160 generates a modified input signal $S_{MOD}$, which is a delayed and modified reproduction of the analog input signal on the input port 102 corresponding to the delays and modifications introduced by the first amplifier 120. Preferably, the modified input signal $S_{MOD}$ has substantially the same amplitude as the analog input signal $S_{IN}$ over the audio bandwidth.

As discussed above, the first amplifier 120 is implemented as a switching amplifier in preferred embodiments. Such switching amplifiers have inherent phase delays caused by the operation of the components within the switching circuit. The phase delays vary with frequency. Preferably, by selecting D(s) to be equal to H(s), as discussed above, the phase delays through the signal processing circuit 160 are selected to be substantially equal to the corresponding phase delays from the input to the output of the first amplifier 120. Because the phase delays through a particular type of amplifier may vary from component to component, the signal processing circuit 160 is advantageously adjustable so that the phase delays through the signal processing circuit 160 can be matched to the phase delays through a particular first amplifier 120 by varying the transfer function D(s).

The inverting input terminal 156 of the summing circuit 150 is connected to an output terminal 172 of a low-pass filter (LPF) 170 to receive a feedback signal $S_{FB}$. The low-pass filter 170 has an input terminal 174 that is connected to an output terminal 182 of an analog divider (DIV) circuit 180. The analog divider circuit 180 has an input terminal 184 connected to the output node 104 to receive the output signal $S_{OUT}$. Thus, the input terminal 184 of the analog divider circuit 180 receives the sum of the amplified output signal $V_1$ generated by the first amplifier 120 across the two output terminals 124, 126 and the correction signal $V_2$ generated by the second amplifier 130 across the two output terminals 134 and 136. Absent any signal generated by the second amplifier 130, the output signal $S_{OUT}$ applied to the speaker 110 (or other transducer) corresponds to the amplified output signal $V_1$ generated by the first amplifier 120. In one particular implementation, the divider circuit 180 is advantageously implemented as a resistive voltage divider network having resistance values selected to provide a selected attenuation of the output signal $S_{OUT}$ to offset the amplification provided by the first amplifier 120. For example, if the first amplifier 120 provides an amplification of approximately 100, then the resistance values in the divider circuit 180 are selected to provide an attenuation of approximately 100 (i.e., the amplitude of the output of the divider circuit 180 is equal to 1/100 the amplitude of the input of the divider circuit 180). Thus, the analog output of the divider circuit 180 has the same order of magnitude as the analog input signal $S_{IN}$.

In most cases of operation, the output signal $S_{OUT}$ is primarily generated by the first amplifier 120 so that relatively small voltage swings on the input signal $S_{IN}$ cause relatively large voltage swings on the output signal $S_{OUT}$ (e.g., $S_{OUT}$ is approximately equal to $100 \times S_{IN}$). The output signal $S_{OUT}$ is fed back via the analog divider circuit 180 and the low-pass filter 170 to provide the feedback signal $S_{FB}$ to the inverting input terminal 156 of the summing circuit 150. The summing circuit 150 compares the feedback signal $S_{FB}$ to the modified input signal $S_{MOD}$ at the output of the signal processing circuit 160, and generates an error signal $S_{ERR}$ on the output terminal 152. The error signal $S_{ERR}$ is provided as the input signal to the second amplifier 130 via the input terminal 132. The attenuation of the divider circuit 180 can be selected or adjusted to precisely offset the ideal gain of the first amplifier 120 so that, absent any distortion or other anomaly in the first amplifier 120, the feedback signal $S_{FB}$ is substantially equal to the modified input signal $S_{MOD}$. The low-pass filter 170 receives the attenuated output signal $S_{OUT}$ and removes most of the residual high frequency switching components in the output signal $S_{OUT}$ to produce the feedback signal $S_{FB}$.

It should be understood that the relative locations of the low-pass filter 170 and the divider circuit 180 can be interchanged such that the output signal $S_{OUT}$ is first filtered by the low-pass filter 170 and then attenuated by the divider circuit 180.

The error signal $S_{ERR}$ is the difference between the two inputs to the summing circuit 150. Thus, in the absence of distortion in the first output signal $V_1$, the error signal $S_{ERR}$ is zero and the output signal $S_{OUT}$ applied to the transducer 110 is equal to the first output signal $V_1$. Since the error signal $S_{ERR}$ provided to the input terminal 132 of the second amplifier 130 is zero, the second amplifier 130 generates a zero voltage differential as the second output voltage $V_2$ across the two output terminals 134, 136. Therefore, the second amplifier 130 does not change the output voltage $S_{OUT}$ if there is no distortion.

On the other hand, when the first amplifier 120 introduces distortion in the first output signal $V_1$, the feedback signal $S_{FB}$ at the inverting input terminal 156 of the summing circuit 150 will differ from modified input signal $S_{MOD}$ at the non-inverting input terminal 154 by an amount proportional to the distortion introduced by the first amplifier 120. The difference between the modified input signal $S_{MOD}$ and the feedback signal $S_{FB}$ is provided on the output terminal 152 of the summing circuit 150 as the error signal $S_{ERR}$ applied to the input 132 of the second amplifier 130. The second amplifier 130 amplifies the error signal $S_{ERR}$ and provides an amplified error signal as the second output voltage $V_2$ between the two output terminals 134, 136.

It can be readily seen that the amplified error voltage generated by the second amplifier 130 has the proper polarity to reduce the distortion in the output signal. For example, if distortion in the first amplifier 120 causes the first output signal $V_1$ to have an amplitude that is greater than the expected amplitude, then the feedback signal $S_{FB}$ is greater than the modified input signal $S_{MOD}$. Thus, the output of the summing circuit 150 on the output terminal 152 is a negative signal that causes the second amplifier 130 to generate a negative voltage $V_2$ between the two output terminals 134, 136. That is the first output terminal 134 will have a lower voltage than the voltage on the second output terminal 136. Thus, the second output voltage $V_2$ generated by the second amplifier 130 will subtract from the first output voltage $V_1$ generated by the first amplifier 120, thereby reducing the total output voltage $S_{OUT}$ between the output node 104 and the ground reference to the expected value.

Similarly, if distortion in the first amplifier 120 causes the first output signal $V_1$ to have an amplitude that is less than it should be, then the feedback signal $S_{FB}$ is less than the modified input signal $S_{MOD}$, and the error signal $S_{ERR}$ is positive. Thus, the second amplifier 130 amplifies the positive error signal $S_{ERR}$ and generates an amplified positive voltage $V_2$ between the output terminals 134, 136. The amplified positive second output voltage $V_2$ in series with the first output voltage $V_1$ generated by the first amplifier 120 adds to the output of the first amplifier 120 to thereby increase the series voltage and thus increase the output signal $S_{OUT}$ to the expected amplitude.

The second amplifier 130 is in series with the first amplifier 120 and therefore must provide the same current handling capability as the first amplifier 120; however, the second amplifier 130 does not have to accommodate the large voltage swings that must be generated by the first amplifier 120. For example, in an embodiment where the first amplifier 120 generates a signal having a voltage swing of ±10 volts and having a maximum distortion of approximately 10% (i.e., a maximum of ±1 volt distortion), the linear amplifier only has to generate a maximum of ±1 volt between the output terminals 134, 136 to offset the distortion. Thus, although the second amplifier 130 must provide the same or greater closed loop amplification as the first amplifier 120 (e.g., an amplification of 100), the second amplifier 130 must provide that amplification over a much smaller voltage range. The second amplifier 130, which generates a smaller voltage swing is much easier to design and manufacture as a low-distortion linear amplifier in contrast to an amplifier that must generate the much larger voltage swings of the first amplifier 120.

One skilled in the art will appreciate that the open loop gain of the second amplifier 130 is selected so that the second amplifier 130 operating in the closed loop configuration shown in FIG. 2 is able to reduce the error voltage $S_{ERR}$ to a very small amplitude.

As further shown in FIG. 2, the preferred embodiment of the present invention includes an isolator circuit 190 having an input terminal 192 connected to receive the input signal $S_{IN}$ from the input port 102. For example, as discussed above, the input signal may have a amplitude that varies between ±0.1 volt with respect to the ground reference. That amplitude would be sufficient to control the first amplifier 120 if the input circuitry of the first amplifier 120 were referenced to the ground reference; however, as shown in FIG. 2, the first amplifier 120 is referenced to the output terminal 134 of the second amplifier 130. As discussed above, the second amplifier 130 generates an output voltage $V_2$ that may vary ±1 volt with respect to the ground reference. Thus, the circuitry within the first amplifier 120 must float with respect to the ground reference. Because the first amplifier 120 is floating with respect to the ground reference, the input signal $S_{IN}$ cannot generally be directly connected to the input terminal 122 of the first amplifier 120. Rather, the isolator circuit 190 is included to isolate the input signal $S_{IN}$ from the input terminal 122 of the first amplifier 120 so that an isolated input signal $S_{ISO}$ applied to the input terminal 122 of the first amplifier 120 can be referenced to the internal circuitry of the first amplifier 120 rather than being referenced to the ground reference. Isolator circuits are known to one skilled in the art. For example, one exemplary isolator circuit 190 comprises a transformer having its primary winding referenced to the ground reference and having its secondary winding coupled to the input circuitry of the first amplifier 120. Alternatively, optical coupling, capacitive coupling or other known isolation systems can be used. As a further alternative, the isolator circuitry may be included as part of the input circuitry of the first amplifier 120.

Figure 3:
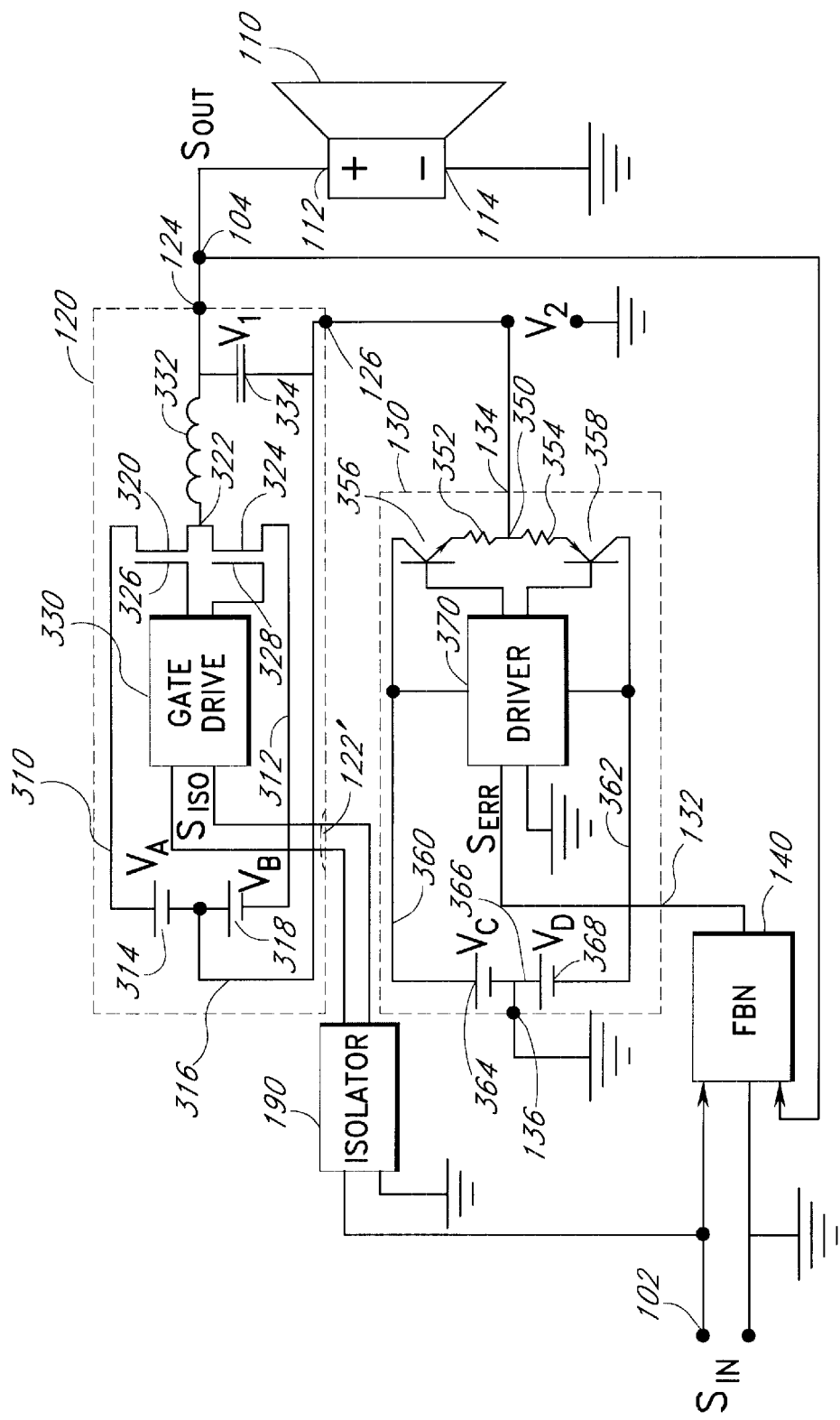
FIG. 3 illustrates the amplification system of FIGS. 1 and 2 with further detail showing the interconnection of the output drivers of the switching amplifier and the linear amplifier, wherein the switching amplifier is implemented as a half-bridge amplifier.

FIG. 3 illustrates one embodiment of the present invention in which the first amplifier 120 of FIGS. 1 and 2 is implemented as a half-bridge switching amplifier and in which the second amplifier 130 of FIGS. 1 and 2 is implemented as a linear amplifier with a typical push-pull output stage. In FIG. 3, the first amplifier 120 comprises a first voltage bus 310 and a second voltage bus 312. The first voltage bus 310 has a voltage $V_A$ that is generated by the relatively positive output of a first voltage supply 314. The relatively negative output of the first voltage supply 314 is connected to a first common reference bus 316. The second voltage bus has a voltage $V_B$ that is generated by the relatively negative output of a second voltage supply 318. Preferably, the voltage $V_A$ and the voltage $V_B$ are substantially equal. The relatively positive output of the second voltage supply 318 is connected to the first common reference bus 316. The two voltage supplies 314, 318 are illustrated in FIG. 3 as batteries; however, it should be understood that one or both voltage supplies can be advantageously implemented as electronic power supplies (e.g., AC to DC convertors, or the like).

The first amplifier 120 further comprises a first switching transistor 320 connected between the first supply bus 310 and a common node 322. A second switching transistor 324 is connected between the common node 322 and the second supply bus 312. The first switching transistor 320 has a control terminal 326, and the second switching transistor 324 has a control terminal 328. In the illustrated embodiment, the switching transistors 320, 324 are advantageously implemented as field effect transistors (FETs), and the control terminals 326, 328 are the gate terminals of the FETs which control the on/off states of the FETs.

The control terminals 326, 328 are connected to the outputs of a gate drive circuit 330. The gate drive circuit 330 operates in a conventional manner for a switching amplifier, and the details of the gate drive circuit 330 will not be described herein. One skilled in the art will readily appreciate that the gate drive circuit 330 selectively turns on the first switching transistor 320 or the second switching transistor 324 by applying a control voltage to the respective control terminal 326 or 328, thus alternatively coupling the node 322 to the first voltage bus 310 and then to the second voltage bus 312. The time during which the first switching transistor 320 is on and the time when the second switching transistor 324 is on are precisely controlled to provide a signal on the node 322 that is alternately positive with respect to the first common reference bus 316 and then negative with respect to the first common reference bus 316. One skilled in the art of switching amplifier design will appreciated that the times are controlled to provide an average output voltage that is proportional to the input signal applied to the gate drive circuit 330. For example, the switching transistors 320, 324 are advantageously switched by respective control signals at a frequency of 50–500 kHz, with the duty cycles of the two control signals determining the respective on times and off times of each switching transistor. One skilled in the art will further appreciate that the voltage $V_1$ will have a maximum voltage swing of +$V_A$ with respect to the first common reference bus 316 and will have a maximum negative voltage swing of –$V_B$. In the preferred embodiment where $V_B$ is substantially equal to $V_A$, the voltage $V_1$ will vary by ±$V_A$ with respect to the common reference bus 316.

The time-varying voltage on the node 322 is applied to a first terminal of an inductor 332. The inductor 332 has a second terminal that is connected to a first terminal of a capacitor 334. The capacitor 334 has a second terminal connected to the first common reference bus 316. The second terminal of the inductor 332 and the first terminal of the capacitor 334 are connected to the first output terminal 124 of the first amplifier 120. The first output terminal 124 is connected to the output node 104, as described above in connection with FIGS. 1 and 2.

The inductor 332 and the capacitor 334 comprise a low-pass filter that demodulates the high-frequency, time-varying PWM signal on the node 322 to the amplified version of the original input signal. For example, when the present invention is used as an audio amplifier, the low-pass filter may substantially attenuate frequencies above approximately 20 kHz. Thus, substantially none of the high-frequency components appear in the signal on the output node 104 that is applied to the transducer (e.g., speaker) 110.

As further illustrated in FIG. 3, the gate drive circuit 330 receives control input signals from the isolator circuit 190, discussed above in connection with FIG. 2. The isolator circuit 190 receives the input signal $S_{IN}$ from the input port 102. The input signal $S_{IN}$ is referenced to the ground reference. The isolator circuit 190 has an output that floats with respect to the ground reference. The isolator circuit 190 reproduces the input signal $S_{IN}$ as the isolated input signal $S_{ISO}$ that is provided across a pair of input terminals 122' of the gate drive circuit 330. The input terminals 122' to the gate drive circuit 330 correspond to the input terminal 122 of the first amplifier 120 in FIG. 2.

The first common reference bus 316 of the first amplifier 120 of FIG. 3 is connected to the second output terminal 126. Thus, it can be seen that that the output voltage generated by the first amplifier 120 across the capacitor 334 is generated between the first output terminal 124 and the second output terminal 126, as discussed above in connection with FIGS. 1 and 2. One skilled in the art will appreciate that the first amplifier 120 includes internal feedback (not shown) from the first output terminal 124 or from the node 322 to the gate drive circuit 330 to enable the gate drive circuit 330 to control the duty cycle of the control signals applied to the control terminals 326, 328 of the switching transistors 320, 324 so that the voltage $V_1$ across the capacitor 334 is proportional to the isolated input signal $S_{ISO}$.

The second output terminal 126 of the first amplifier 120 is connected to the first output terminal 134 of the second amplifier 130. The first output terminal 134 of the second amplifier 130 is connected to a common node 350 connecting respective first terminals of a first output resistor 352 and a second output resistor 354. The aforementioned resistors may or may not be present on the chosen output stage topology.

The second terminal of the first output resistor 352 is connected to the emitter of a current sourcing transistor 356, which, in the illustrated embodiment, is an npn transistor. The second terminal of the second output resistor 354 is connected to the emitter of a current sinking transistor 358, which, in the illustrated embodiment, is a pnp transistor.

The collector of the current sourcing transistor 356 is connected to a relatively positive voltage bus 360. The collector of the current sinking transistor 358 is connected to a relatively negative voltage bus 362.

The voltage bus 360 has a voltage $V_C$ that is generated by the relatively positive output of a voltage supply 364. The relatively negative output of the voltage supply 364 is connected to a common reference bus 366. The voltage bus 362 has a voltage $V_D$ that is generated by the relatively negative output of a voltage supply 368. The relatively positive output of the voltage supply 368 is connected to the common reference bus 366. The two voltage supplies 364, 368 are illustrated in FIG. 3 as batteries; however, it should be understood that one or both voltage supplies can be advantageously implemented as electronic power supplies (e.g., AC to DC convertors, or the like).

The current sourcing transistor 356 and the current sinking transistor 358 have respective base terminals that are connected to respective outputs of a driver circuit 370. The driver circuit 370 has supply voltage inputs that are connected to the voltage bus 360 and to the voltage bus 362. The driver circuit 370 is also referenced to the ground reference. The driver circuit 370 has an input connected to the input terminal 132 and thus receives the error signal $S_{ERR}$ generated on the output terminal 142 of the feedback network (FBN) 140, discussed above with respect to FIGS. 1 and 2. The driver circuit 370 operates in a conventional manner in response to the error signal $S_{ERR}$ applied to its input and generates control currents to the bases of the two transistors 356 and 358 to generate a signal on the node 134 that has a voltage amplitude $V_2$ responsive to the instantaneous amplitude of the error signal $S_{ERR}$. The signal on the node 134 is referenced to the ground reference and may be either positive or negative with respect to the ground reference. Since the voltage $V_2$ at the node 134 is in series with the voltage $V_1$ generated by the first amplifier 120, the voltage $V_2$ is either added to or subtracted from the voltage $V_1$ to generate the output signal $S_{OUT}$.

It should be understood that the second amplifier 130 preferably includes internal feedback (not shown) from the node 134 to the driver circuit 370 to enable the driver circuit 370 to compare the generated output voltage $V_2$ with the desired output voltage to maintain the output voltage $V_2$ proportional to the error signal $S_{ERR}$.

Figure 4:
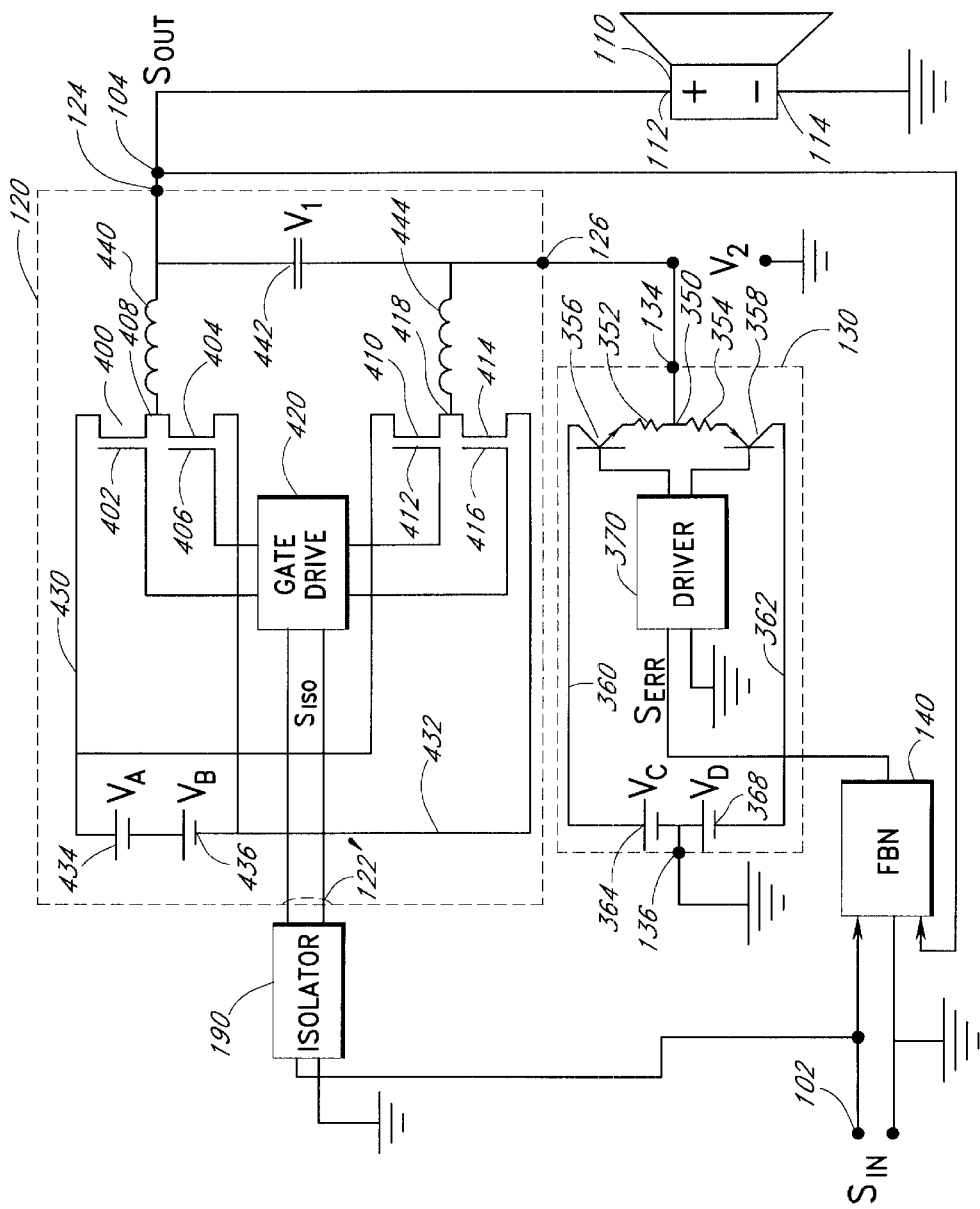
FIG. 4 illustrates the amplification system of FIGS. 1 and 2 with further detail showing the interconnection of the output drivers of the switching amplifier and the linear amplifier, wherein the switching amplifier is implemented as a full-bridge amplifier.

FIG. 4 illustrates an alternative embodiment to the embodiment of FIG. 3. In FIG. 4, the first amplifier 120 is implemented as a full-bridge switching amplifier rather than a half-bridge switching amplifier. The second amplifier 130 is implemented as described above in connection with FIG. 3 and has been numbered accordingly. The input to the second amplifier 130 is coupled to the output of the feedback network 140 as further described above.

The full-bridge first amplifier 120 of FIG. 4 comprises a first pair of switching transistors in which a first transistor 400 has a control terminal 402 and a second transistor 404 has a control terminal 406. The transistors 400, 404 are interconnected at a first output node 408. The first amplifier 120 further comprises a second pair of switching transistors in which a third transistor 410 has a control terminal 412 and a fourth transistor 414 has a control terminal 416. The transistors 410, 414 are interconnected at a second output node 418. The control terminals 402, 406, 412, 416 are connected to respective outputs of a gate drive circuit 420. The input to the gate drive circuit 420 is connected to the output of the isolator circuit 190 via the input terminals 122', as discussed above.

In the illustrated embodiment, the switching transistors 400, 404, 410, 414 are implemented as field effect transistors (FETs). The control terminals 402, 406, 412, 416 are the gate terminals of the FETs. The source of the first transistor 400 is connected to the drain of the second transistor 404 at the first output node 408. The source of the third transistor 410 is connected to the drain of the fourth transistor 414 at the second output node 418. The drain of the first switching transistor 400 is connected to a relatively positive voltage bus 430, and the source of the second switching transistor 404 is connected to a relatively negative voltage bus 432. Similarly, the drain of the third switching transistor 410 is connected to the relatively positive voltage bus 430, and the source of the fourth switching transistor 414 is connected to the relatively negative voltage bus 432. The voltage on the relatively positive voltage bus 430 is generated with respect to the relatively negative voltage bus 432 via a voltage source, which is represented by a first battery 434 that generates a voltage $V_A$ and a second battery 436 that generates a voltage $V_B$. The two batteries 434, 436 are connected in series so that the voltage on the relatively positive voltage bus 430 has a voltage of $V_A + V_B$ with respect to the voltage on the relatively negative voltage bus 432. One skilled in the art will appreciate that the two batteries 434, 436 can be advantageously replaced with alternative power sources, such as, for example, electronic power supplies. Furthermore, in FIG. 4, the two batteries 434, 436 can be replaced with a single battery or alternative voltage source having the voltage $V_A + V_B$. The two batteries 434, 436 are shown in FIG. 4 to facilitate a comparison below between the half-bridge switching amplifier of FIG. 3 and the full-bridge switching amplifier of FIG. 4.

The first output node 408 is connected to a first terminal of a first inductor 440. A second terminal of the first inductor 440 is connected to a first terminal of a capacitor 442 and is also connected to the first output terminal 124 of the first amplifier 120. As shown in FIGS. 1 and 2, the first output terminal 124 is connected to the output node 104. The second output node 418 is connected to a first terminal of a second inductor 444. A second terminal of the second inductor 444 is connected to a second terminal of the capacitor 442 and is also connected to the second output terminal 126 of the first amplifier 120. As shown in FIGS. 1 and 2, the second output terminal 126 is connected to the first output terminal 134 of the second amplifier 130. The output voltage $V_1$ from the first amplifier 120 is developed across the capacitor 442 between the first output terminal 124 and the second output terminal 126.

The operation of a full-bridge switching amplifier is well-known in the art. The gate drive circuit 420 applies control signals to the control terminals 402, 406, 412, 416 of the switching transistors to selectively turn on one transistor from the first pair of transistors 400, 404 and to turn on one transistor from the second pair of transistors 410, 414. In particular, the gate drive circuit 420 turns on the first transistor 400 at the same time that it turns on the fourth transistor 414 so that current flows from the relatively positive voltage bus 430 through the first transistor 400, through the first inductor 440, through the capacitor 442, through the second inductor 444 and through the fourth transistor 414 to the relatively negative voltage bus 432. The current flow in this first direction operates to increase the voltage on the capacitor 442 positively between the first output terminal 124 and the second output terminal 126.

The gate drive circuit 420 further operates to turn off the first transistor 400 and the fourth transistor 414 and then turn on the second transistor 404 and the third transistor 410. When the second transistor 404 and the third transistor 410 are turned on, current flows from the relatively positive voltage bus 430 through the third transistor 410, through the second inductor 444, through the capacitor 442 (in the opposite direction from before), through the first inductor 440 and through the second transistor 404 to the relatively negative voltage bus 432. The current flow in this second direction operates to decrease the voltage on the capacitor 442 positively (or increase the voltage negatively) between the first output terminal 124 and the second output terminal 126. As discussed above in connection with FIG. 3, the gate drive circuit 420 switches at a relatively high frequency of, for example, 50–500 kHz. The gate drive circuit 420 adjusts the duty cycle that determines when the first transistor 400 and the fourth transistor 414 are turned on and when the second transistor 404 and the third transistor 410 are turned on. When the first transistor 400 and the fourth transistor 414 are turned on for a longer duration than the second transistor 404 and the third transistor 410 are turned on during each cycle, the voltage $V_1$ across the capacitor 442 will increase (i.e., become more positive). When the second transistor 404 and the third transistor 410 are turned on for a longer duration than the first transistor 400 and the fourth transistor 414 are turned on during each cycle, the voltage $V_1$ across the capacitor 442 will decrease (i.e., become more negative). The inductors 440, 444 and the capacitor 442 operate as a low-pass filter so that the voltage $V_1$ across the capacitor 442 represents the average voltage generated by the switching transistors. The gate drive circuit 420 controls the switching transistors so that the average voltage is proportional to the isolated input signal $S_{ISO}$ applied to the input to the gate drive circuit 420. One skilled in the art will appreciate that the first amplifier 120 includes internal feedback (not shown) sensed differentially between the first output terminal 124 and the second output terminal 126 or sensed differentially between the first output node 408 and the second output node 418. The gate drive circuit 420 responds to the internal feedback to control the duty cycle of the control signals applied to the control terminals 402, 406, 412, 416 of the switching transistors 400, 404, 410, 414 so that the voltage $V_1$ across the capacitor 442 is proportional to the isolated input signal $S_{ISO}$.

As described above in connection with FIGS. 1, 2 and 3, the voltage $V_1$ across the capacitor 442 generated by the first amplifier 120 is added to the voltage $V_2$ generated by the second amplifier 130 so that the voltage $V_2$ corrects distortion in the voltage $V_1$.

Although the full-bridge switching amplifier of FIG. 4 operates in a similar manner to the half-bridge switching amplifier of FIG. 3, one skilled in the art will appreciate that the full voltage difference between the relatively positive voltage bus 430 and the relatively negative voltage bus 432 (i.e., $V_A+V_B$) is switched across the capacitor 442. Assuming that $V_A$ is equal to $V_B$, then the voltage across the capacitor 442 in FIG. 4 will switch by $\pm 2V_A$, in contrast to the voltage across the capacitor 334 in FIG. 3, which switches by $\pm V_A$. Thus, the embodiment of FIG. 4 provides twice the output voltage swing of the embodiment of FIG. 3 but requires additional components (e.g., four switching transistors instead of two switching transistors and two inductors instead of one inductor).

Figure 5:
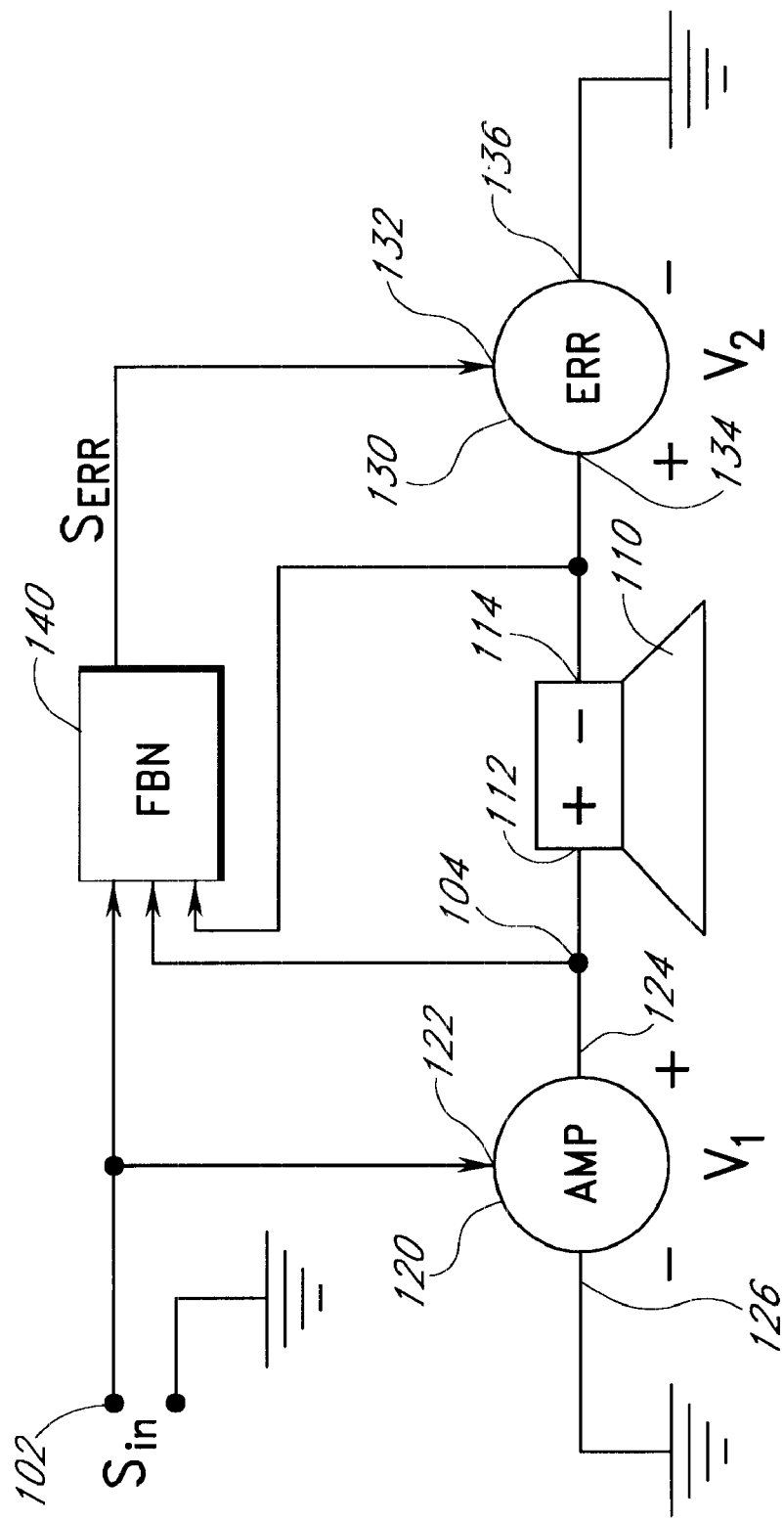
FIG. 5 illustrates an alternative amplification system in which the switching amplifier and the linear amplifier are connected to the load in a bridge configuration.

FIG. 5 illustrates a block diagram of a further embodiment of the present invention in which the first amplifier 120 and the second amplifier 130 are again connected in series; however, in FIG. 5, the two amplifiers 120, 130 are connected to the transducer (i.e., speaker) 110 in a bridge configuration. In particular, the second output terminal 126 of the first amplifier 120 and the second output terminal 136 of the second amplifier 130 are both connected to the ground reference. The first output terminal 124 of the first amplifier 120 is connected to the output node 104 and to the first terminal 112 of the transducer 110. The first output terminal 134 of the second amplifier 130 is connected to the second terminal 114 of the transducer 110. It can be seen that first amplifier 120, the second amplifier 130 and the transducer 110 are connected in series. Unlike the previously described configurations, the bridge configuration of FIG. 5 allows both amplifiers 120, 130 to be connected to the ground reference so that an isolator circuit is not required for either amplifier. Note that the voltage across the transducer 110 in FIG. 5 is not referenced to the ground reference. In FIG. 5, the voltage applied between the two terminals 112, 114 of the transducer 110 is the difference between the voltage $V_1$ generated by the first amplifier 120 and the voltage $V_2$ generated by the second amplifier 130.

In FIG. 5, the input terminal 122 of the first amplifier 120 receives the input signal $S_{IN}$ (which is referenced to the ground reference) from the input port 102 and generates the voltage $V_1$ at the first output terminal 124 in response to the input signal. The feedback network (FBN) 140 receives the input signal $S_{IN}$ as a first input and receives the output voltage $V_1$ from the first amplifier 120 and the output voltage $V_2$ from the second amplifier 130 as a differential feedback signal that together are provided as a second input to the feedback network. As shown, the feedback signal in FIG. 5 represents the differential voltage across the transducer 110, and the feedback signal is not referenced to the ground reference. The differential voltage is converted to a ground referenced voltage within the feedback network 140 and is divided and filtered as discussed above. The feedback network 140 compares the resulting feedback voltage to the input signal $S_{IN}$ and generates the error signal $S_{ERR}$. The error correction signal $S_{ERR}$ is provided as the control input to the input terminal 132 of the second amplifier 130. The second amplifier 130 responds to the error signal $S_{ERR}$ and generates the voltage $V_2$ in response to the error signal, as discussed above.

One skilled in the art will appreciate that the first amplifier 120 in FIG. 5 is preferably implemented as a half-bridge switching amplifier as shown in FIG. 3 since the second terminal 126 of the half-bridge switching amplifier is readily connected to the ground reference.

Figure 6:
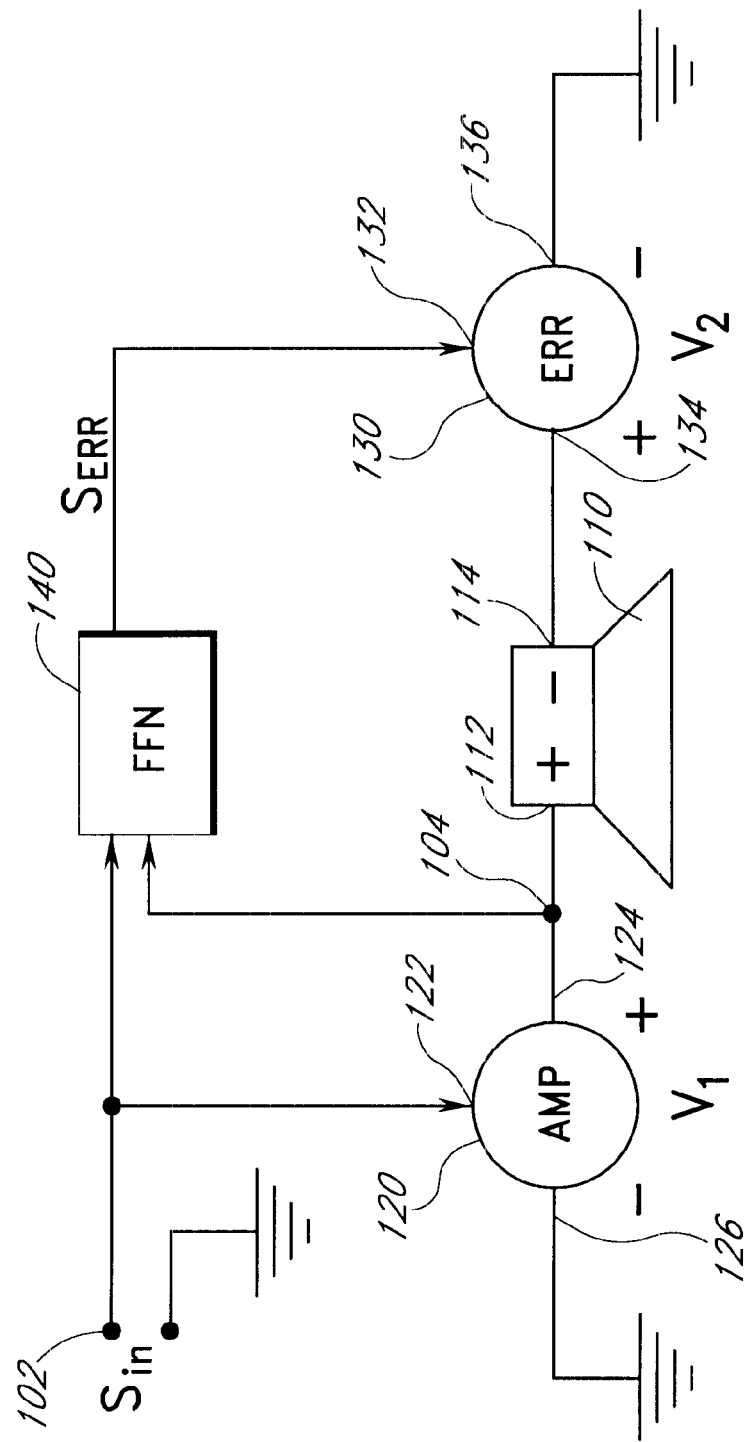
FIG. 6 illustrates an alternative amplification system in which the switching amplifier and the linear amplifier are connected to the load in a bridge configuration as in FIG. 5 and in which the error correction is provided as feedforward error correction.

The embodiment of FIG. 5 can be modified as shown in FIG. 6 to operate in a feedforward configuration by eliminating the signal line from the output of the second amplifier 130. In FIG. 6, only the voltage $V_1$ from the first amplifier 120 is provided to an error correction circuit (FFN) 140, which divides and filters the voltage, as discussed above, to generate an internal voltage to compare with the input voltage. The error correction circuit 140 compares the divided and filtered voltage to the input signal $S_{IN}$ and generates an error signal $S_{ERR}$ that represents the difference between the desired voltage and the voltage generated by the first amplifier 120. The second amplifier 130 amplifies the error signal and generates the voltage $V_2$, which represents the difference between the voltage $V_1$ and the desired voltage across the transducer 110. For example, if the error signal $S_{ERR}$ is positive, indicating that the voltage $V_1$ is more positive than the desired voltage, then the voltage $V_2$ will also be positive. Since the voltage $V_2$ is subtracted from the voltage $V_1$ in the bridge configuration, the voltage across the transducer 110 will be reduced to the desired voltage. Similarly, if the error signal $S_{ERR}$ is negative, indicating that the voltage $V_1$ is more negative than the desired voltage, then the voltage $V_2$ will also be negative. Since the negative voltage $V_2$ is subtracted from the voltage $V_1$ in the bridge configuration, the magnitude of the voltage $V_2$ will be effectively added to the voltage $V_1$ to cause the voltage across the transducer 110 to be increased to the desired voltage. As shown in FIG. 6, the correction voltage $V_2$ generated by the second amplifier 130 is not included as part of the signal fed back to the error correction network 140. Rather, only the voltage $V_1$ generated by the first amplifier 120 is provided as an input to the error correction network 140. Thus, the amplification system shown in FIG. 6 is operating as a feedforward system rather than as a feedback system.

Figure 7:
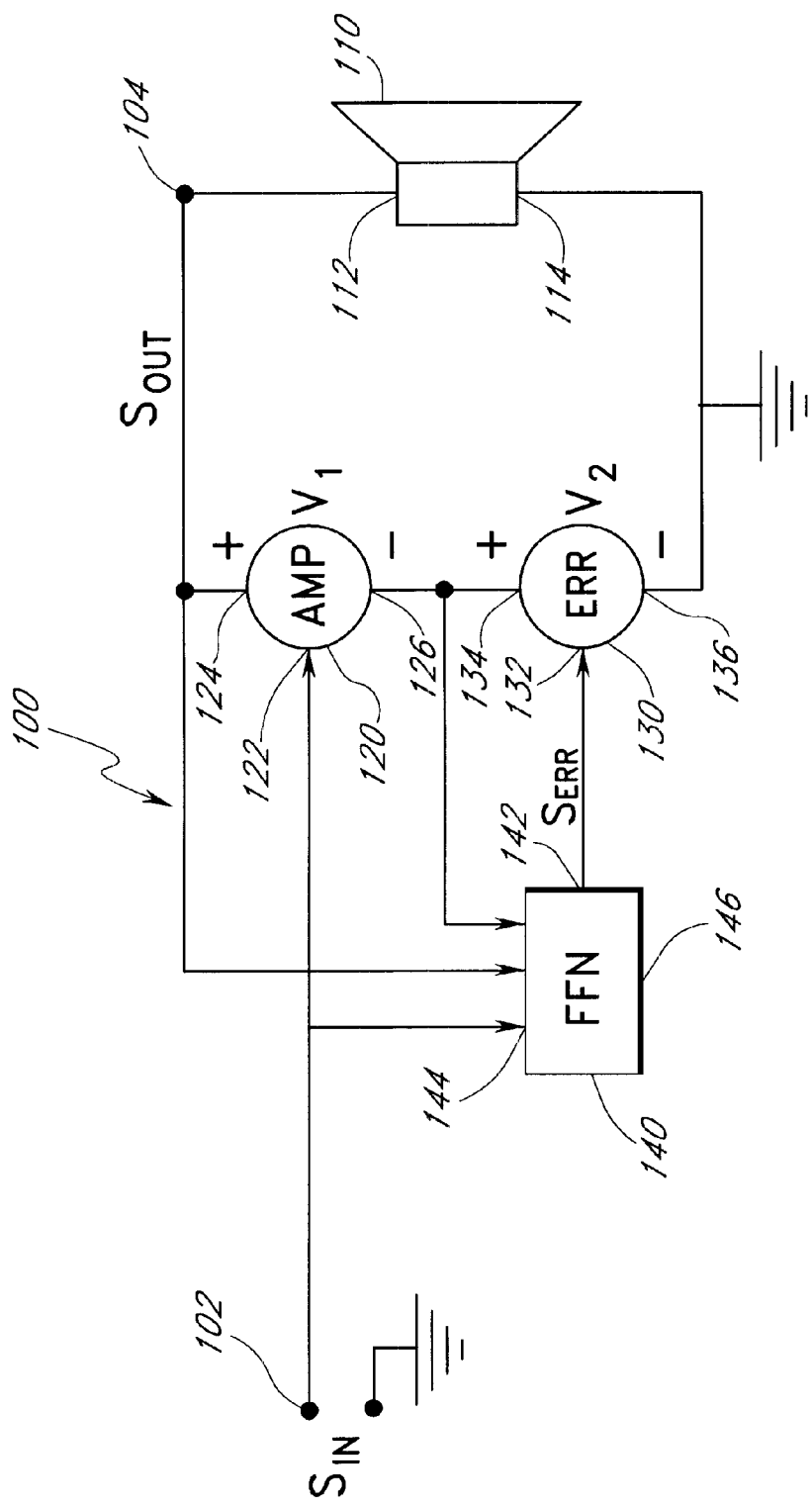
FIG. 7 illustrates an alternative amplification system connected as in FIG. 1 in which the error correction is provided as feedforward error correction.

The embodiment of FIG. 1 can also be configured as a feedforward system as shown in FIG. 7. The embodiment of FIG. 7 is similar to the embodiment of FIG. 1 except that an error correction network (FFN) 140 receives a differential input signal that represents the voltage $V_1$ generated by the first amplifier 120. The differential signal is converted to a signal referenced to ground and is divided and filtered within the error correction network 140 to generate an internal signal to compare with the input signal $S_{IN}$. The error correction network 140 generates the error signal $S_{ERR}$, which is provided as the control input to the second amplifier 130. The second amplifier 130 amplifies the error signal $S_{ERR}$ to generate the voltage $V_2$ in series with the voltage $V_1$. The voltage $V_2$ is added to or subtracted from the voltage $V_1$ in accordance with the respective polarities of the two voltages to generate the output voltage $S_{OUT}$ applied to the transducer 110. It can be seen that the effect of the voltage $V_2$ is not included within the signal provided to the error correction network 140. Thus, the embodiment of FIG. 7 is operating as a feedforward system.

Figure 8:
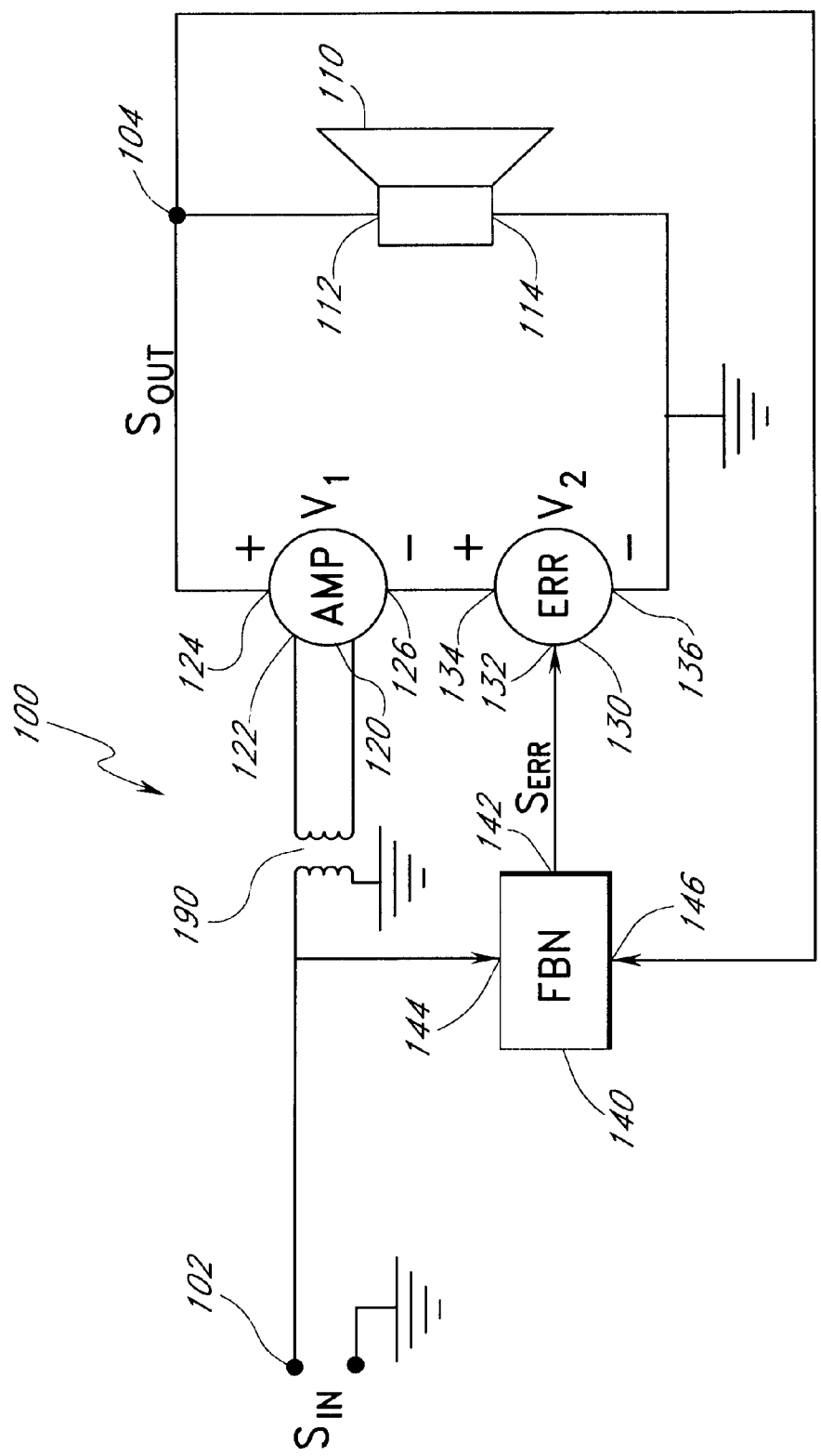
FIG. 8 illustrates an alternative amplification system connected as in FIG. 1 in which the input to the first amplifier is isolated by a transformer.

FIG. 8 illustrates one particular embodiment of the present invention in which the isolator 190 is implemented as a transformer that couples the input signal $S_{IN}$ to the first amplifier 120. As discussed above, by using the transformer or another type of isolator 190, the signal applied to the input of the first amplifier 120 is not referenced to the common ground reference and may be referenced to the internal reference buses within the first amplifier 120.

Figure 9:
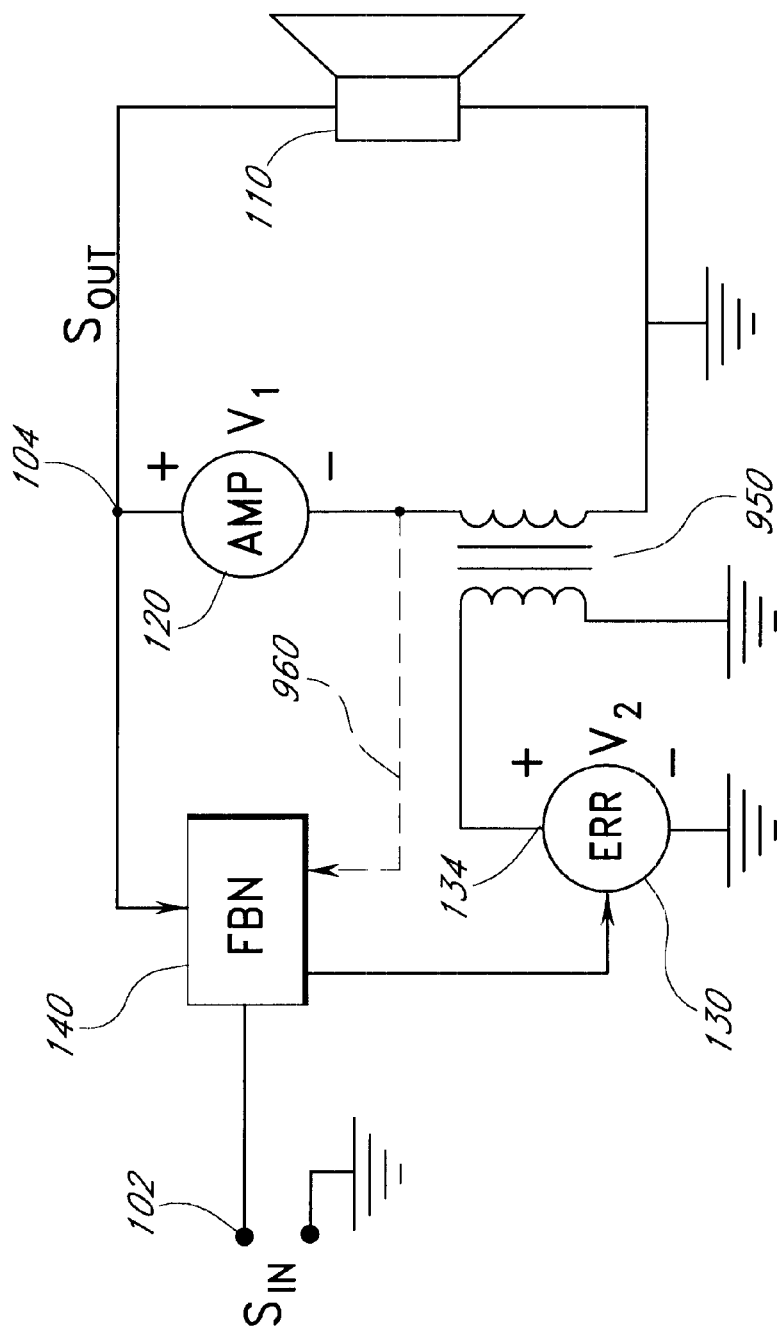
FIG. 9 illustrates an embodiment similar to the embodiment of FIG. 1 in which the output of the second amplifier is coupled to the primary of a transformer, and in which the secondary of the transformer in series with the first amplifier.
Figure 10:
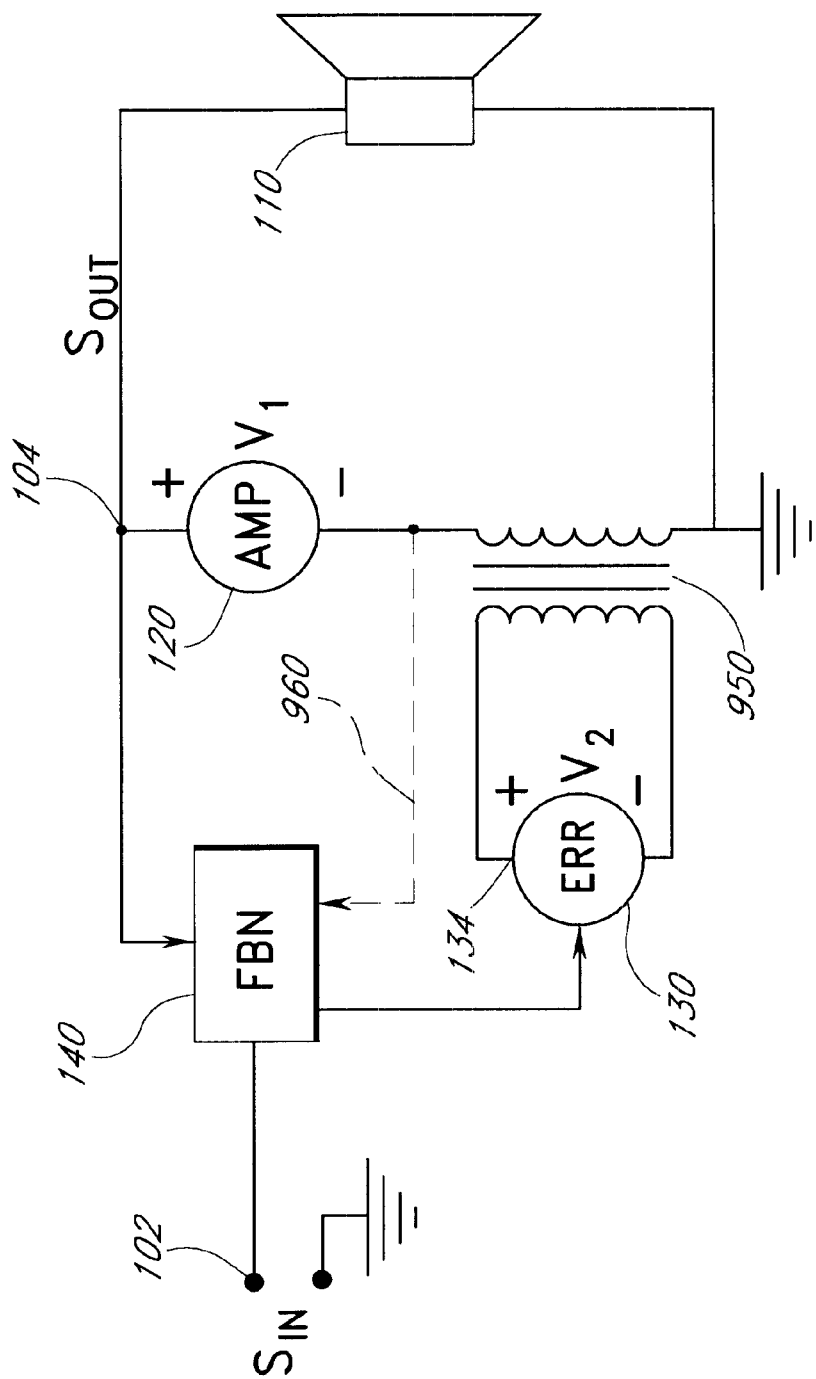
FIG. 10 illustrates an embodiment similar to the embodiment of FIG. 9 in which the output of the second amplifier is a differential output coupled to the primary of a transformer, and in which the secondary of the transformer in series with the first amplifier.

FIGS. 9 and 10 illustrate further embodiments similar to the embodiment of FIG. 1 in which the output of the second amplifier 130 is coupled to the primary of a transformer 950. In FIG. 9, the second amplifier 130 is referenced to the ground reference and one terminal of the primary of the transformer 950 is referenced to the ground reference. The output terminal 134 of the second amplifier 130 is coupled to the other terminal of the primary of the transformer 950. The secondary of the transformer 950 is coupled in series with the first amplifier 120. Thus, the transformer-coupled output signal from the second amplifier 130 is added to the output signal from the first amplifier 120. The turns ratio of the primary and secondary of the transformer 950 can be selected to transform the voltage of the output of the second amplifier 130 to the desired voltage. For example, the second amplifier 130 can be a high voltage, low current amplifier, and the turns ratio is selected to decrease the voltage from the secondary while increasing the current. This is particularly advantageous in embodiments where it is desired to operate the second amplifier 130 from the same power supply as the first amplifier 120.

The embodiment of FIG. 10 is similar to the embodiment of FIG. 9 except that the output of the second amplifier 130 is a differential output. Thus, the primary of the transformer 950 is not referenced to ground.

With respect to both FIGS. 9 and 10, it should be understood that the positions of the first amplifier 120 and the second amplifier 130 can be interchanged so that the first amplifier 120 is referenced to ground, thus eliminating the need for an isolator on the input of the first amplifier 120.

FIGS. 9 and 10 illustrate feedback embodiments. As further shown in FIGS. 9 and 10 by a dashed line 960, the signal provided to the correction network 140 can be a differential signal taken across the outputs of the first amplifier 120 only, as discussed above with respect to FIGS. 6 and 7, in which cases the embodiments of FIGS. 9 and 10 operate in a feedforward mode.

Other combinations of amplifiers can also be incorporated into the present invention. For example, the linear amplifier used as the error amplifier 130 of FIGS. 1–10 can be replaced with a low-distortion Class D switching amplifier or replaced with other amplifiers, such as, for example, a Class G amplifier or a Class H amplifier. Since the required voltage swing of the second amplifier 130 is much less than the voltage swing required for the first amplifier 120, it is much easier to obtain a low-distortion amplifier at the lower voltage levels.

As a further modification of the amplification system, the half-bridge first amplifier 120 of FIG. 3 may be connected to the ground reference and the second amplifier 130 may be floated with respect to ground by passing the error signal $S_{ERR}$ through the isolator circuit 190.

It can be seen from the foregoing, that the present invention provides the benefits of a low cost, high efficiency switching amplifier having a large voltage swing while also providing the low distortion characteristics of a linear amplifier without having to construct a linear amplifier that operates over a wide voltage range and at high power levels.

While preferred embodiments of this invention have been disclosed herein, those skilled in the art will appreciate that changes and modifications may be made therein without departing from the spirit and scope of the invention as defined in the appended claims.

What is claimed is:

1. An apparatus that amplifies an input signal and that generates a low-distortion output signal, comprising:
   a first amplifier having a first input that receives an input signal to be amplified and having a first output that generates a first output signal that is an amplified reproduction of the input signal, the first output signal having distortion;
   a second amplifier having a second input that receives an error signal, the second amplifier having a second output that generates a second output signal that is an amplified reproduction of the error signal, the first output of the first amplifier and the second output of the second amplifier being connected in series to generate a system output signal that is the sum of the first output signal and the second output signal; and a correction circuit that compares a signal responsive to the input signal to a signal responsive to at least the first output signal of the first amplifier and generates the error signal provided to the second amplifier.

2. The apparatus as defined in claim 1, wherein the first amplifier is a switching amplifier.

3. The apparatus as defined in claim 2, wherein the first amplifier is a half-bridge switching amplifier.

4. The apparatus as defined in claim 2, wherein the first amplifier is a full-bridge switching amplifier.

5. The apparatus as defined in claim 1, wherein the second amplifier is a linear amplifier.

6. The apparatus as defined in claim 1, wherein the system output signal is applied to a load.

7. The apparatus as defined in claim 6, wherein the load is a transducer.

8. The apparatus as defined in claim 7, wherein the transducer is an audio transducer.

9. The apparatus as defined in claim 8, wherein the audio transducer is a speaker.

10. An apparatus that amplifies an input signal and that generates a low-distortion output signal, comprising:

a first amplifier having a first input that receives an input signal to be amplified and having a first output that generates a first output signal that is an amplified reproduction of the input signal, the first output signal having distortion;

a second amplifier having a second input that receives an error signal, the second amplifier having a second output that generates a second output signal that is an amplified reproduction of the error signal, the first output of the first amplifier and the second output of the second amplifier being connected in series to generate a system output signal that is the sum of the first output signal and second output signal, wherein the system output signal is applied to a load, wherein the load has first and second terminals and wherein the load connected in series with the first amplifier and the second amplifier; and a correction circuit that compares a signal responsive to the input signal to a signal responsive to at least the first output signal of the first amplifier and generates the error signal provided to the second amplifier.

11. The apparatus as defined in claim 10, wherein one terminal of the load is connected to a voltage reference and wherein the first amplifier and the second amplifier are connected in series between the voltage reference and the other terminal of the load.

12. The apparatus as defined in claim 10, wherein the first amplifier is connected between a voltage reference and one terminal of the load and wherein the second amplifier is connected between the voltage reference and the other terminal of the load.

13. An apparatus that amplifies an input signal and that generates a low-distortion output signal, comprising:

a first amplifier having a first input that receives an input signal to be amplified and having a first output that generates a first output signal that is an amplified reproduction of the input signal, the first output signal having distortion;

a second amplifier having a second input that receives an error signal, the second amplifier having a second output that generates a second output signal that is an amplified reproduction of the error signal, the first output of the first amplifier and the second output of the second amplifier being connected in series to generate a system output signal that is the sum of the first output signal and second output signal, wherein the system output signal is applied to a load; and a correction circuit that compares a signal responsive to the input signal to a signal responsive to at least the first output signal of the first amplifier and generates the error signal provided to the second amplifier, wherein the signal responsive to at least the first output signal of the first amplifier is responsive to a sum of the first output signal and the second output signal, and the error correction circuit and the second amplifier provide feedback error correction.

14. An apparatus that amplifies an input signal and that generates a low-distortion output signal, comprising:

a first amplifier having a first input that receives an input signal to be amplified and having a first output that generates a first output signal that is an amplified reproduction of the input signal, the first output signal having distortion;

a second amplifier having a second input that receives an error signal, the second amplifier having a second output that generates a second output signal that is an amplified reproduction of the error signal, the first output of the first amplifier and the second output of the second amplifier being connected in series to generate a system output signal that is the sum of the first output signal and second output signal, wherein the system output signal is applied to a load; and a correction circuit that compares a signal responsive to the input signal to a signal responsive to at least the first output signal of the first amplifier and generates the error signal provided to the second amplifier, wherein the signal responsive to at least the first output signal of the first amplifier is responsive to only the first output signal, and the error correction circuit and the second amplifier provide feedback error correction.

15. An apparatus that amplifies an input signal and that generates a low-distortion output signal, comprising:

a primary amplifier that receives an input signal to be amplified and that generates an first output voltage responsive to the input signal;

a secondary amplifier connected in series with the primary amplifier, the secondary amplifier receiving an error signal and generating a second output voltage responsive to the error signal; and at least one output terminal that provides a system output voltage equal to the sum of the first output voltage and the second output voltage.

16. A method of generating a low-distortion output signal in response to an input signal, comprising:

receiving an input signal to be amplified;

generating a first output signal that is an amplified reproduction of the input signal, the first output signal including distortion;

generating a second output signal that is an amplified reproduction of an error signal, the second output signal being generated in series with the first output signal;

adding the first output signal and the second output signal to generate a system output signal; and generating the error signal by comparing a signal responsive to at least the first output signal with a signal responsive to the input signal.

17. The apparatus as defined in claim 16, wherein the signal responsive to at least the first output signal is responsive to a sum of the first output signal and the second output signal.

18. The apparatus as defined in claim 16, wherein the signal responsive to at least the first output signal is responsive to only the first output signal.

19. A method of generating a low-distortion output signal in response to an input signal, comprising:

receiving an input signal to be amplified;

generating a first output voltage that is an amplified reproduction of the input signal with distortion;

generating a second output voltage that is an amplified reproduction of an error signal representing the distortion in the first output voltage, the second output voltage being generated in series with the first output signal; and adding the first output voltage and the second output voltage to generate a system output voltage in which the distortion in the first output voltage is reduced by the second output voltage.

20. An apparatus that amplifies an input signal and that generates an output signal, comprising:

a first amplifier that receives an input signal to be amplified and that generates a first output voltage responsive to the input signal;

a second amplifier connected in series with the first amplifier, the second amplifier receiving a signal responsive to the input signal and generating a second output voltage responsive to the input signal; and at least one output terminal that provides a system output voltage equal to the sum of the first output voltage and the second output voltage.

* * * * *

UNITED STATES PATENT AND TRADEMARK OFFICE
CERTIFICATE OF CORRECTION

PATENT NO. : 6,476,674 B2 Page 1 of 1
DATED : November 5, 2002
INVENTOR(S) : Michael Smedegaard-Pedersen et al.

It is certified that error appears in the above-identified patent and that said Letters Patent is hereby corrected as shown below:

Title page,
Add the following item:
-- Related U.S. Application Data
[60]   Provisional application No. 60/257,188, filed on December 20, 2000. --

Column 1,
Line 3, add the following caption and text:
-- RELATED APPLICATION
This application claims the benefit of priority under 35 U.S.C. § 119(e) from U.S. Provisional Patent Application No. 60/257,188 filed on December 20, 2000 --

Signed and Sealed this

First Day of April, 2003

JAMES E. ROGAN
*Director of the United States Patent and Trademark Office*